(12) United States Patent
Golle et al.

(10) Patent No.: US 8,471,274 B2
(45) Date of Patent: Jun. 25, 2013

(54) LED LIGHT DISPOSED ON A FLEXIBLE SUBSTRATE AND CONNECTED WITH A PRINTED 3D CONDUCTOR

(75) Inventors: Aaron J. Golle, Shakopee, MN (US); John T. Golle, Eden Prairie, MN (US); Walter J. Paciorek, Phoenix, AZ (US)

(73) Assignee: Heilux, LLC, Eden Prairie, MN (US)

( * ) Notice: Subject to any disclaimer, the term of this patent is extended or adjusted under 35 U.S.C. 154(b) by 0 days.

(21) Appl. No.: 13/492,718

(22) Filed: Jun. 8, 2012

(65) Prior Publication Data
US 2013/0082298 A1 Apr. 4, 2013

Related U.S. Application Data

(63) Continuation of application No. 13/346,518, filed on Jan. 9, 2012.

(60) Provisional application No. 61/542,736, filed on Oct. 3, 2011.

(51) Int. Cl.
*H01L 29/18* (2006.01)
*H01L 33/00* (2010.01)

(52) U.S. Cl.
USPC .................................. 257/88; 257/40; 257/99

(58) Field of Classification Search
USPC .......................................... 257/99, 88, 79, 40
See application file for complete search history.

(56) References Cited

U.S. PATENT DOCUMENTS

| | | | |
|---|---|---|---|
| 7,633,093 B2 | 12/2009 | Blonder et al. | |
| 7,858,994 B2 | 12/2010 | Daniels | |
| 7,863,760 B2 | 1/2011 | Daniels et al. | |
| 7,909,481 B1 | 3/2011 | Zhang et al. | |
| 7,952,107 B2 | 5/2011 | Daniels et al. | |
| 8,334,152 B2 | 12/2012 | Speier | |
| 8,338,849 B2 | 12/2012 | Tischler et al. | |
| 2001/0037892 A1* | 11/2001 | Corisis | 174/52.1 |
| 2003/0076649 A1* | 4/2003 | Speakman | 361/524 |
| 2006/0038792 A1* | 2/2006 | Sano et al. | 345/173 |
| 2006/0131596 A1 | 6/2006 | Ouderkirk et al. | |
| 2006/0197102 A1* | 9/2006 | Ogihara et al. | 257/99 |
| 2007/0090387 A1 | 4/2007 | Daniels et al. | |
| 2009/0029498 A1* | 1/2009 | Yamazaki et al. | 438/30 |
| 2009/0261357 A1 | 10/2009 | Daniels | |
| 2009/0302760 A1* | 12/2009 | Tchakarov et al. | 313/512 |
| 2011/0136324 A1 | 6/2011 | Ashdown et al. | |
| 2011/0151114 A1 | 6/2011 | Ashdown et al. | |

(Continued)

OTHER PUBLICATIONS

"Semprius.com", [online]. [archived Jan. 31, 2011]. Retrieved from the Internet: <http://web.archive.org/web/20110131193652/http://semprius.com/>, (2011), 1 pg.

(Continued)

*Primary Examiner* — Jarrett Stark
*Assistant Examiner* — John M Parker
(74) *Attorney, Agent, or Firm* — Schwegman, Lundberg & Woessner, P.A.

(57) ABSTRACT

An example includes subject matter (such as an apparatus) comprising a planar substrate including a first surface that is planar, at least one bare light emitting diode ("LED") die coupled to the substrate and conductive ink electrically coupling the at least one bare LED die, wherein the conductive ink is disposed on the substrate and extends onto a surface of the LED that is out-of-plane from the first surface.

19 Claims, 17 Drawing Sheets

U.S. PATENT DOCUMENTS

| | | |
|---|---|---|
| 2011/0151588 A1 | 6/2011 | Ashdown et al. |
| 2011/0151602 A1 | 6/2011 | Speier |
| 2011/0163682 A1 | 7/2011 | Jungwirth |
| 2011/0315956 A1 | 12/2011 | Tischler et al. |
| 2011/0316422 A1 | 12/2011 | Tischler et al. |
| 2012/0027557 A1 | 2/2012 | Ashdown et al. |
| 2012/0094406 A1 | 4/2012 | Patel et al. |
| 2012/0146066 A1 | 6/2012 | Tischler et al. |
| 2012/0155078 A1 | 6/2012 | Ashdown et al. |
| 2012/0175667 A1 | 7/2012 | Golle et al. |
| 2012/0212138 A1 | 8/2012 | Jungwirth et al. |
| 2012/0217496 A1 | 8/2012 | Tischler et al. |
| 2012/0248477 A1 | 10/2012 | Tischler et al. |

OTHER PUBLICATIONS

Kloepel, J. E., "New silver-based ink has applications in printed electronics", [online] 2009. Retrieved from the Internet: <URL: http://news.illinois.edu/news/09/0212ink.html>, (Apr. 13, 2009), 2 pgs.

* cited by examiner

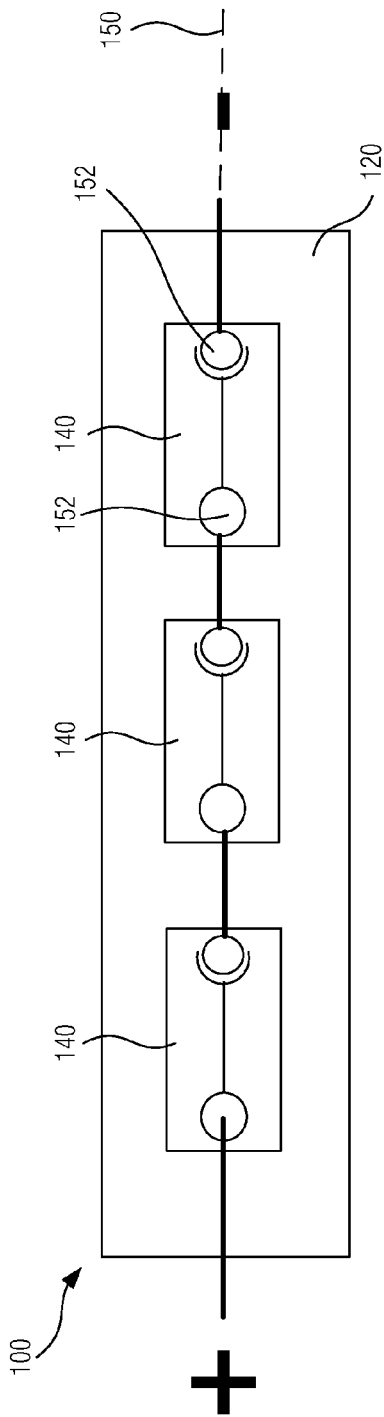
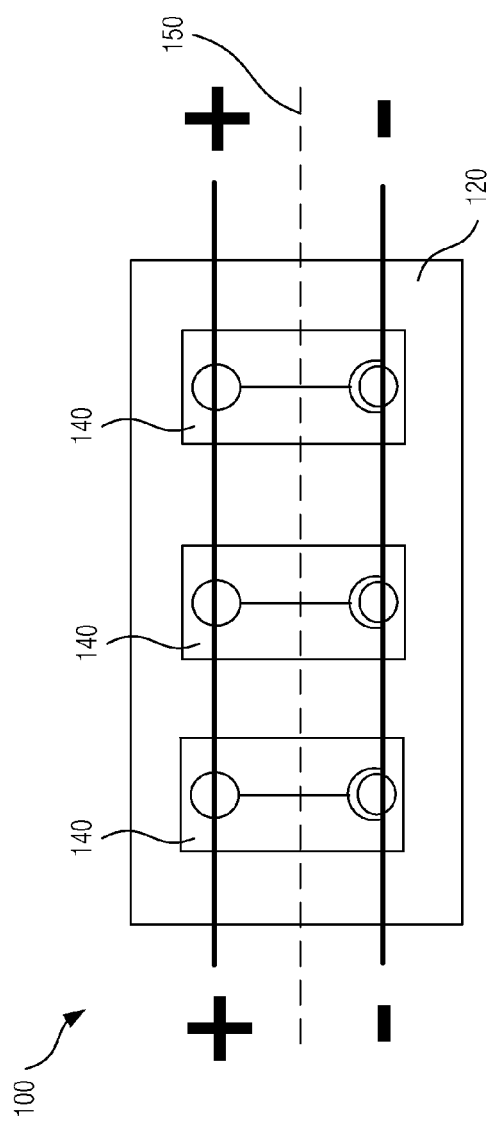

LED LIGHT DISPOSED ON A FLEXIBLE SUBSTRATE AND CONNECTED WITH A PRINTED 3D CONDUCTOR

CLAIM OF PRIORITY

This patent application is a continuation of and claims priority under 35 U.S.C. §120 to U.S. patent application Ser. No. 13/346,518, entitled "LED Light Disposed on a Flexible Substrate and Connected with a Printed 3D conductor," filed on Jan. 9, 2012, which claims the benefit of priority, under 35 U.S.C. Section 119(e), to U.S. Provisional Patent Application Ser. No. 61/542,736, entitled "LED Light Disposed on a Flexible Substrate and Connected with a Printed 3D conductor," filed on Oct. 3, 2011, which is hereby incorporated by reference herein in its entirety.

BACKGROUND

Artificial light sources, such as incandescent light bulbs, burn inefficiently, sometimes with only 10% efficiency, consuming excess power and generating waste heat. Further, these devices have limited service lives.

Other light sources such as fluorescent tubes and/or CFLs (compact fluorescent lights) contain mercury and are hazardous to our environment.

Emerging light sources including light emitting diodes ("LEDs") address many of the efficacy and life issues but currently are expensive to manufacture and have form factors that are not appealing to the consumers. What is needed is a new way to mass produce solid state lighting modules that can be produced inexpensively and meet the needs of both commercial and residential consumers. Devices that generate less heat, last longer, and are friendly to the environment.

BRIEF DESCRIPTION OF THE DRAWINGS

The drawings illustrate generally, by way of example, but not by way of limitation, various embodiments discussed in the present document.

FIG. 1A is an example showing a top view of a configuration of LEDs in a circuit.

FIG. 1B is an example showing a top view of a configuration of LEDs in a circuit.

DETAILED DESCRIPTION

Figure 2:
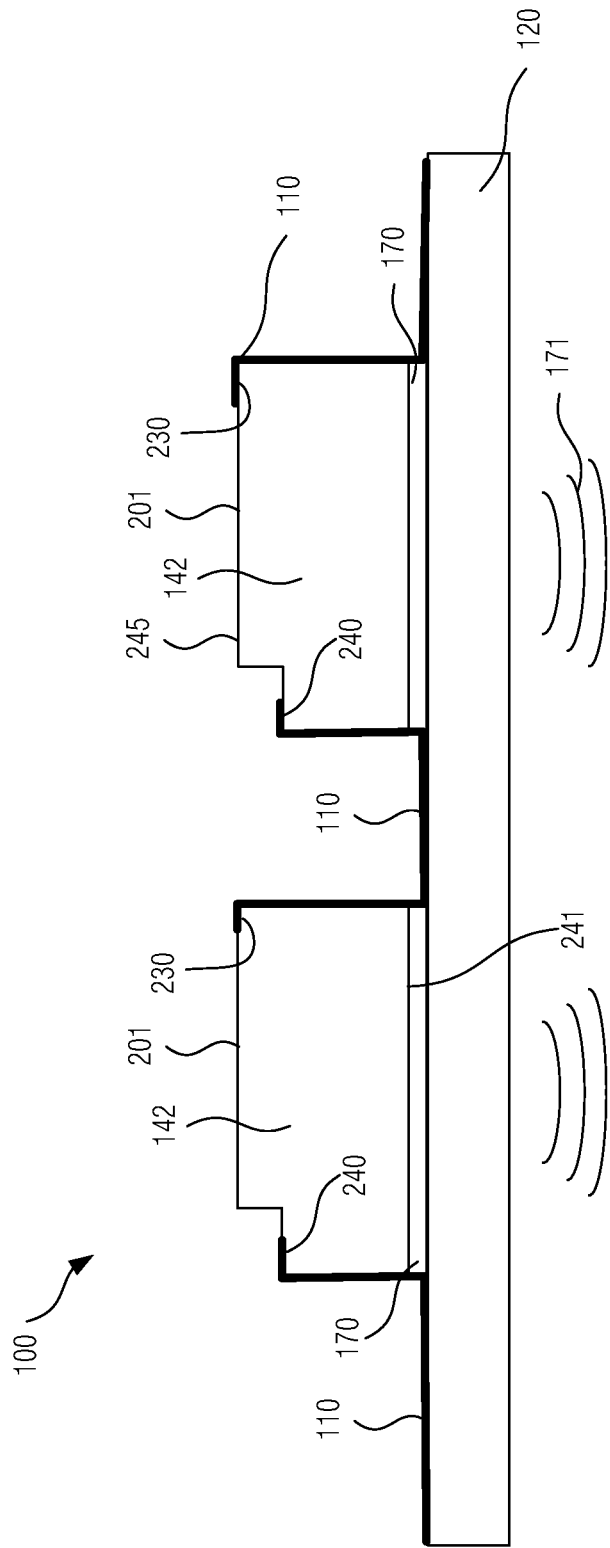
FIG. 2 is a side view of a LED circuit with horizontal bare LED dies, according to an example.

FIG. 1A and FIG. 1B are examples of configurations of three die 140 in a circuit 100. The present subject matter includes circuit having one or more die. The circuit 100 can include a first substrate 120, such as to provide a base for the components of the circuit 100 to be fixed to. The die 140 can include one or more light emitting diodes ("LEDs"). The LEDs 140 in the circuit 100 can be bare LED dies. The bare LED dies can be horizontal bare LED dies 142, vertical bare LED dies 144, or flip chip bare LED dies 146. The bare LED dies can be coupled to a power source or other bare LED dies.

The coupling between bare LED dies or a power source can be conductive, such as to create a circuit 100. In the configuration of FIG. 1A, the connection pads 152 of the die 140 are disposed along an axis 150. In the configuration of FIG. 1B, connection pads 152 of a first polarity are disposed on a first side of the axis 150, with the connection pads 152 of the other polarity disposed on the other side of the axis 150.

FIG. 2 is a side view of a portion of a circuit 100 with horizontal bare LED dies 142. A circuit 100 can include a first substrate 120. Examples of substrate 120 include, but are not limited to, rigid printed circuit board such as circuit board including organic material and flexible printed circuit board such as circuit board including polyimide material. The first substrate 120 can be flexible, such as to enable the circuit 100 to conform to different shapes. The first substrate 120 can be transparent, such as to allow light 171 to pass. The first substrate 120 can be at least partially reflective. The first substrate 120 can comprise metal. The first substrate 120 can comprise non-conductive metal, such as if the metal is treated or coated.

The first substrate 120 can have an adhesive 170 applied on one or more sides of it, such as to couple the first substrate 120 to one or more bare LED dies. Adhesive such as adhesive 170 can comprise phosphor, such as to produce white light from light emitted from the LED. The adhesive 170 can be conductive. The adhesive 170 can be an electrical insulator.

The one or more bare LED dies can include a horizontal bare LED die 142. A horizontal bare LED die 142 can emit light from the top surface 245 of the bare LED die 142 and the bottom surface 241 of the bare LED die 142. A horizontal bare LED die 142 can have a P-contact 230 and an N-contact 240. The polarity of the contacts can be reversed, so that the contact on the first mesa 201 is of the N-type. In a circuit 100, the P-contact 230 can have a conductive element coupling the P-contact of a first horizontal bare LED die 142 to the N-contact of a second horizontal bare LED die 142, such as to create a conductive electrical connection between the two bare LED dies. In a circuit 100, the P-contact can have a conductive element coupling the P-contact of a first horizontal bare LED die 142 to the P-contact of a second horizontal bare LED die 142, such as to create a conductive electrical connection between the two bare LED dies.

The conductive element can be an ink 110, such as nanoparticle-ink Nanoparticle-ink can be nanoink. The conductive ink 110 can include silver. The conductive ink 110 can include copper. The conductive ink 110 can include gold. Nanoink can comprise nanoparticles and a carrier solvent. Consolidation of the nanoparticles can occur by low temperature sintering. Consolidation can occur when there is particle-to-particle contact, such as when the solvent or a protective material surrounding the nanoparticles evaporates.

The conductive ink 110 can comprise conductive metallic particles, a polymeric binder, and a carrier solvent. The metallic particles can be small enough to be aerosol jet printed. The conductive ink 110 can comprise a polymeric binder, such as to form a film when the conductive ink 110 is dried and fused. A conductive ink 110 that comprises a polymeric binder can be more robust than other conductive inks 110. The conductive ink 110 can comprise nanoink and an ink that comprises conductive metallic particles, a polymeric binder, and a carrier solvent.

The conductive ink 110 can be printed onto the first substrate 120. The conductive ink 110 can be printed onto a horizontal bare LED die 142. The conductive ink 110 can be printed onto a horizontal bare LED die 142 with a jet printer. The conductive ink 110 can be printed onto a horizontal bare LED die 142 with an aerosol jet printer.

An aerosol jet printer can be used to print the conductive ink 110 on to a horizontal bare LED die 142, such as on more than one side of the horizontal bare LED die 142. The conductive ink 110 can be printed onto more than one side of the horizontal bare LED die 142, such as to eliminate the need to flood the area between horizontal bare LED dies 142 in order to electrically couple them. Flooding the area between the horizontal bare LED dies 142 can be used, such as when the printer cannot print on a two perpendicular surfaces.

Aerosol jet printers can print in 3-dimensions. Printing with an aerosol jet printer can create a continuous line of conductive ink 110 over a corner of the horizontal bare LED die 142. Printing the conductive ink 110 with an aerosol jet printer can prevent a gap in the conductive ink 110. A gap can occur when printing conductive ink with a jet printer.

Aerosol jet printers can print using different inks. The particle size of one ink that is printed using an aerosol jet printer can have a different particle size from another ink that is printed with an aerosol jet printer. In an example, an aerosol jet printer can print ink with a particle size up to 0.5 μm. Aerosol jet print can print ink with a particle size smaller than 0.5 μm.

The conductive ink 110 can be printed on one or more surfaces of a horizontal bare LED die 142. For example, two nonplanar surfaces can be printed onto. Curved surfaces can be printed onto. Irregular surfaces can be printed onto. Surfaces that are non continuous, such as those on the exterior of a polyhedron, can be printed onto.

The head of the printer can be at an angle other than vertical, such as to encourage a continuous line of conductive ink 110. A continuous line of conductive ink 110 can be formed by printing in 3 dimensions, such as to connect a line of conductive ink 110 on the first substrate 120 to a line of conductive ink 110 on the top surface of a horizontal bare LED die 142. Printing conductive ink 110 in 3 dimensions can include printing on intersecting planes, for example via adjustment along, and/or printing onto x, y and z planes. Printing conductive ink 110 in 3 dimensions can include printing on parallel planes. The angle of the aerosol jet printer head can be 45°. Other angles of the aerosol jet printer head are possible.

The conductive ink 110 can be disposed in a continuous, monolithic path, such as to form a conductive trace. The conductive ink 110 can be printed in dots. The conductive ink 110 can be heated, such as to melt the dots of conductive ink 110 or fuse the dots of conductive ink 110, so that the dots of conductive ink 110 become electrically conductive with one another. The dots can be melted or fused such as to form a conductive unit of conductive ink 110. The conductive ink 110 can be melted between 200° C. and 220° C. The conductive ink 110 can be melted between 130° C. and 150° C. Other ranges for the melting point of the conductive ink 110 are possible.

Figure 3A:
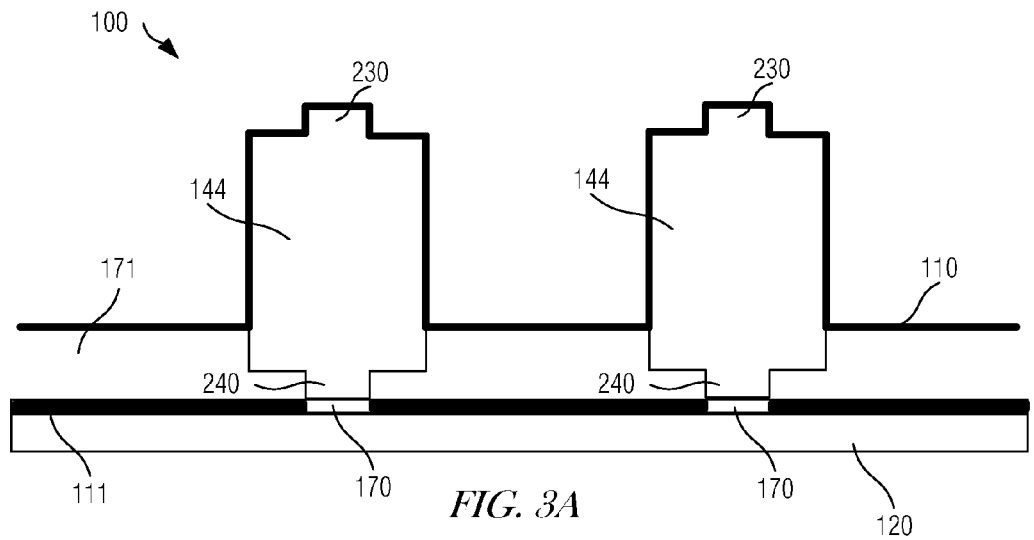
FIG. 3A is a side view of a LED circuit with vertical bare LED dies, according to an example.

FIG. 3A is a side view of a LED circuit 100 with vertical bare LED dies 144. A circuit 100 can include one or more vertical bare LED dies 144. A circuit 100 with vertical bare LED dies 144 can include two lines of conductive ink 110. A first line of conductive ink 110 can connect the N-pads 240 of the vertical bare LED dies 144 in the circuit 100. A second line of conductive ink 111 can connect the P-pads 230 of the vertical bare LED dies 144 in the circuit 100. The polarity of the contacts can be reversed, so that the contact on the top is the P-type.

Both lines of conductive ink 110, 111 can be printed on the first substrate 120. The lines of conductive ink 110, 111 can be substantially parallel to one another. The lines of conductive ink 110, 111 can be electrically insulated from each other, such as by a gap or a non-conductive material 171. The non-conductive material can be a non-conductive ink In an example, a second line of conductive ink 111 can be printed on the first substrate 120 and non-conductive ink can be printed over the second line of conductive ink 111. A first line of conductive ink 110 can be printed on the non-conductive ink, such that the non-conductive ink can electrically insulate the first line of conductive ink 110 from the second line of conductive ink 111.

Figure 3B:
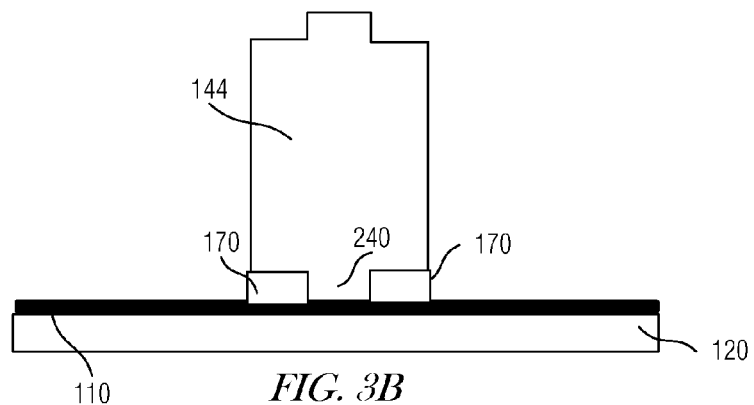
FIG. 3B is a partial view of a circuit, showing a connection between a line of nanoparticle-ink and an N-pad on the bottom of a vertical bare LED die, according to an example.

FIG. 3B is an example of a connection between a line of conductive ink 110 and an N-pad 240 on the bottom of a vertical bare LED die 144. An adhesive 170 can be used to couple a vertical bare LED die 144 to the first substrate 120. The adhesive 170 can be nonconductive. If the adhesive 170 is nonconductive, a continuous line of conductive ink 110 can be printed on the substrate. The line of conductive ink 110 can run between the N-pad 240 of the vertical bare LED die 144 and the first substrate 120.

Figure 3C:
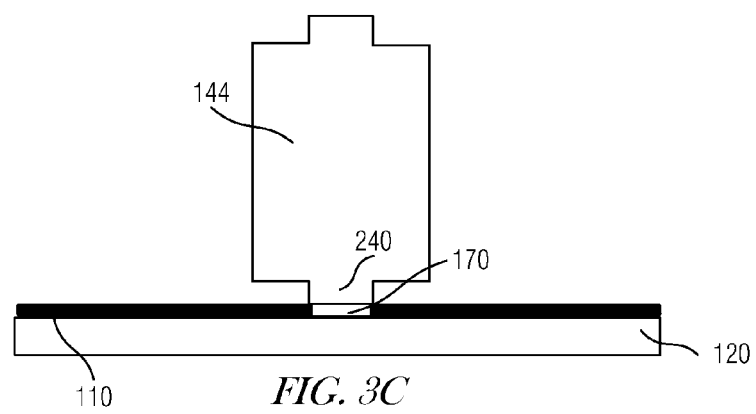
FIG. 3C is a partial view of a circuit, showing a connection between a line of nanoparticle-ink and an N-pad on the bottom of a vertical bare LED die, according to an example.

FIG. 3C is an example of a connection between a line of conductive ink 110 and an N-pad 240 on the bottom of a vertical bare LED die 144. An adhesive 170 can be used to couple a vertical bare LED die 144 to the first substrate 120. The adhesive 170 can be conductive. If the adhesive 170 is conductive, there can be gaps in a line of conductive ink 110.

The adhesive 170 can be located in the gaps, such as to conduct electricity with the conductive ink 110. The adhesive 170 can be coupled to the N-pad 240 of the vertical bare LED die 144, such as to conduct electricity to the vertical bare LED die 144.

Figure 4A:
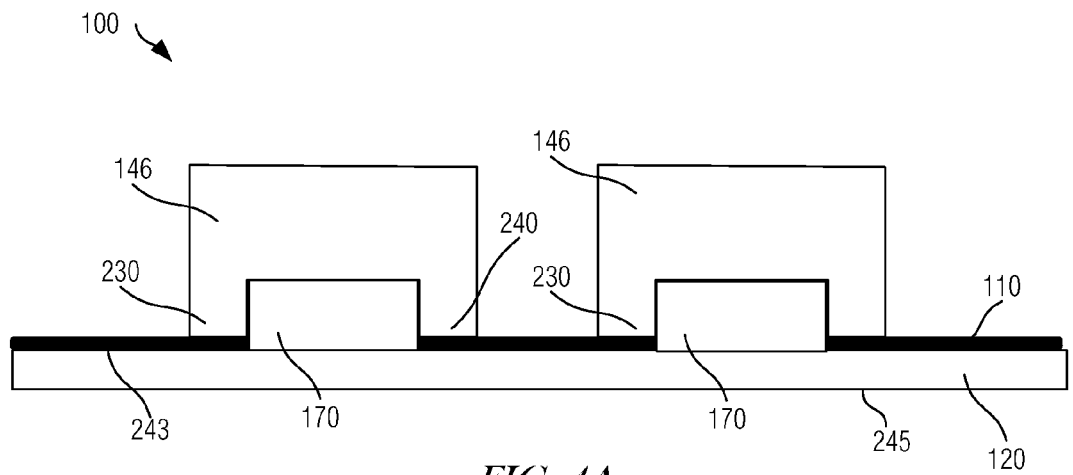
FIG. 4A is a side view of a LED circuit with flip chip bare LED dies, according to an example.

FIG. 4A is a side view of a LED circuit 100 with flip chip bare LED dies 146. A circuit 100 can include one or more flip chip bare LED dies 146. A circuit 100 with flip chip bare LED dies 146 can include a single line of conductive ink 110. A single line of conductive ink 110 can connect a flip chip bare LED die 146 to another flip chip bare LED die 146, such as to include both bare LED dies in a circuit 100.

When a circuit 100 includes more than one bare LED die, the circuit 100 can include different types of bare LED dies. In an example, a circuit 100 can include one or more horizontal bare LED dies 142 and one or more vertical bare LED dies 144 or one or more flip chip bare LED dies 146. In an example, a circuit 100 can include at least one of each type of bare LED die. In an example, a circuit 100 can include both flip chip 146 and vertical bare LED dies 144. A circuit 100 can include LED dies that emit different colors of lights, such as red, green, blue, amber, or ultraviolet. Different colored LED dies can be powered in combinations, such as to produce light of another color or white light.

Figure 4B:
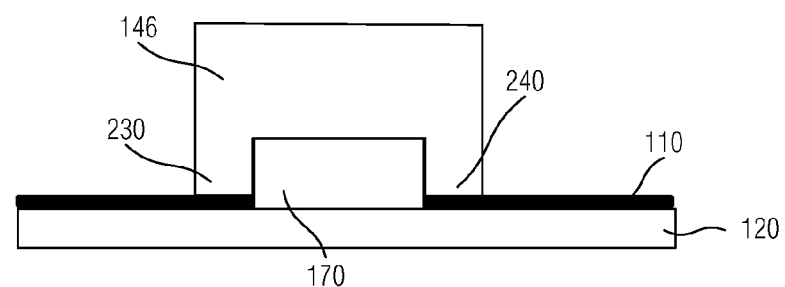
FIG. 4B is a partial view of a circuit, showing a connection between a line of nanoparticle-ink and a P-pad on the bottom of a flip chip bare LED die, according to an example.

FIG. 4B is an example of a connection between a line of conductive ink 110 and a P-pad 230 on the bottom of a flip chip bare LED die 146. An adhesive 170 can be used to couple a flip chip bare LED die 146 to the first substrate 120. The adhesive 170 can be nonconductive. If the adhesive 170 is nonconductive, a line of conductive ink 110 can be printed onto the substrate. The P-pad 230 of the flip chip bare LED die 146 can be placed on the line of conductive ink 110. The N-pad 240 can be set up in a similar manner. The adhesive 170 can be located between the P-pad 230 and the N-pad 240 of the flip chip bare LED die 146.

Figure 4C:
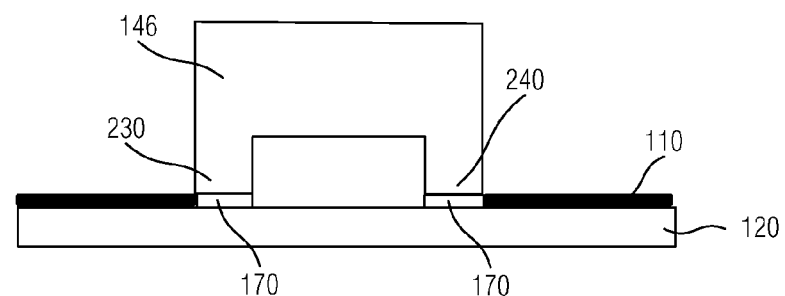
FIG. 4C is a partial view of a circuit, showing a connection between a line of nanoparticle-ink and a P-pad on the bottom of a flip chip bare LED die, according to an example.

FIG. 4C is an example of a connection between a line of conductive ink 110 and a P-pad 230 on the bottom of a flip chip bare LED die 146. An adhesive 170 can be used to couple a flip chip bare LED die 146 to the first substrate 120. The adhesive 170 can be conductive. If the adhesive 170 is conductive, a line of conductive ink 110 printed on the first substrate 120. Adhesive 170 can be added to the end of the line of conductive ink 110. The P-pad 230 on the bottom of a flip chip bare LED die 146 can be located in the adhesive 170, such as to couple the flip chip bare LED die 146 to the first substrate 120. The P-pad 230 on the bottom of a flip chip bare LED die 146 can be located in the adhesive 170, such as to conduct electricity from the line of conductive ink 110 to the P-pad 230. The N-pad 240 can be set up in a similar manner.

A first substrate 120 can have a circuit 100 on more than one side of the first substrate 120. In an example, a first substrate 120 can have a circuit 100 on the top surface 243 of the first substrate 120 and a circuit 100 on the bottom surface 245 of the first substrate 120.

Figure 5:
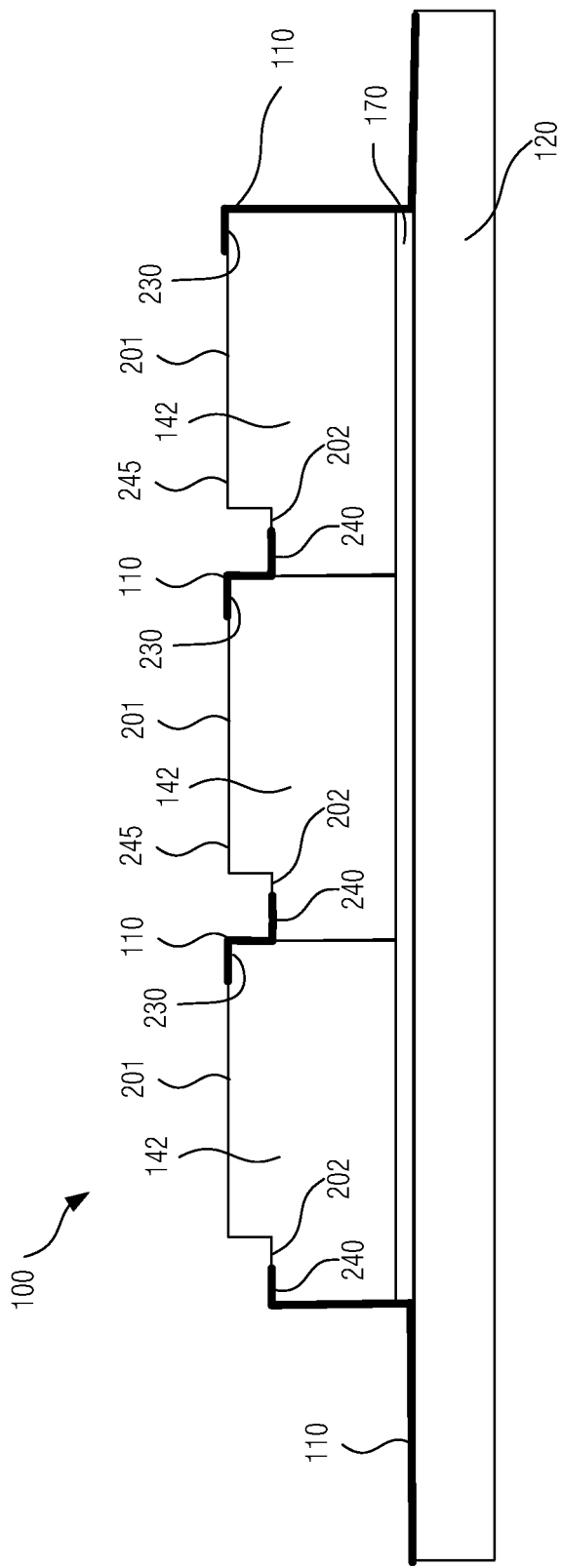
FIG. 5 is a side view of a LED circuit with horizontal bare LED dies, according to an example.

FIG. 5 is a side view of a LED circuit 100 with horizontal bare LED dies 142. In an example, the bare LED dies can be placed next to each other, such as to print the conductive ink 110 on a first bare LED die and then onto a second bare LED die, without printing on the substrate. In an example, one or more portions of the circuit 100 can be printed directly from a bare LED die to another bare LED die and other portions of the circuit 100 can be printed from a bare LED die to the first substrate 120 to another bare LED die. Printing directly from a bare LED die to another bare LED die can result in a higher density of bare LED dies. In the example, printing extends from atop a first mesa 201, from a P-type connection point or pad 230 down onto an N-type connection or pad 240. The N-type connection or pad 240 can be on a second mesa 202. The second mesa 202 can be in a different plane than the first mesa 201. The second mesa 202 can be in a plane that is closer to the first substrate 120, than the plane the first mesa 201 is located in. The first mesa 201 and the second mesa 202 can be substantially parallel to each other. Accordingly, the conductive ink 110 can have a step-shape along a cross section extending through a vertical cross-section.

Figure 6:
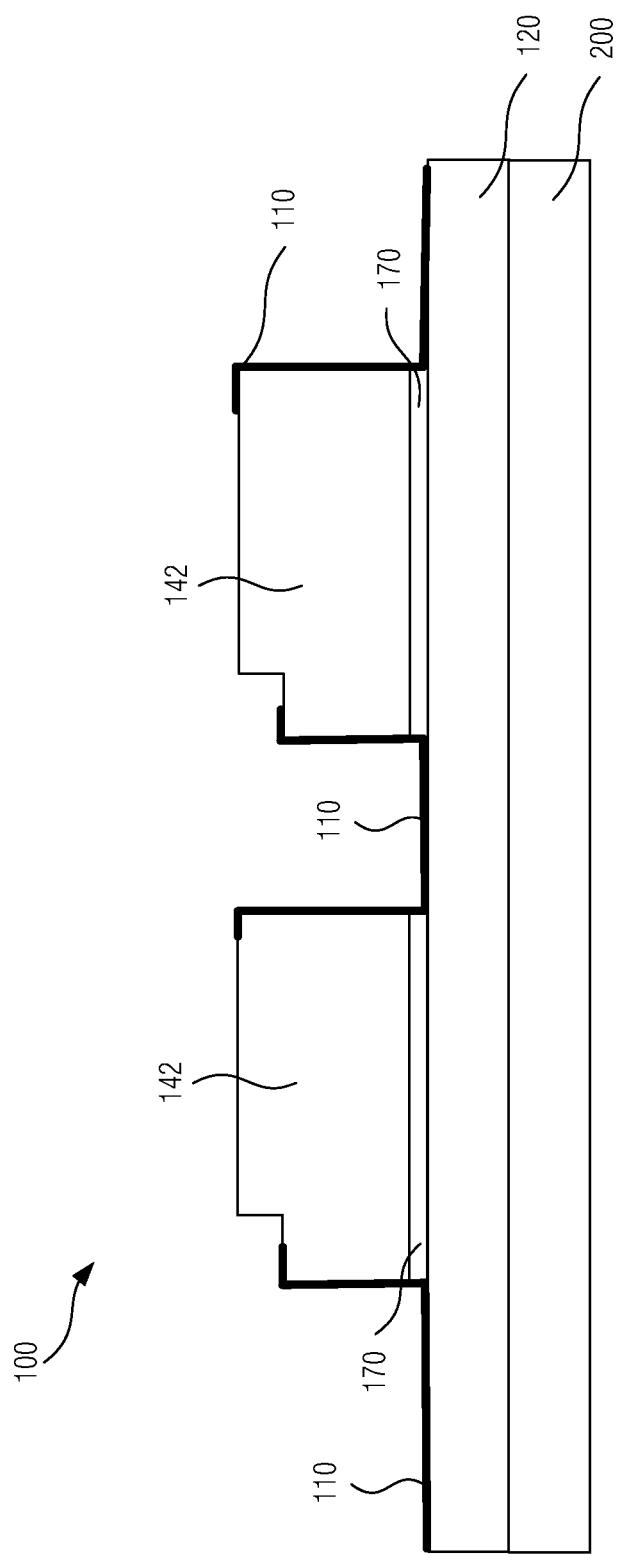
FIG. 6 is a side view of a LED circuit with a heat sink, according to an example.

FIG. 6 is a side view of a LED circuit 100 with a heat sink 200. The circuit 100 can include a heat sink 200. A heat sink 200 can be coupled to the circuit 100, such as to remove heat from the circuit 100. The heat sink 200 can be coupled to the first substrate 120 on the opposite side of the first substrate 120 from the circuit 100. The heat sink 200 can be coupled to the first substrate 120 on the same side of the first substrate 120 as the circuit 100. More than one heat sink 200 can be coupled to the first substrate 120. Other locations for a heat sink 200 are possible.

Figure 7A:
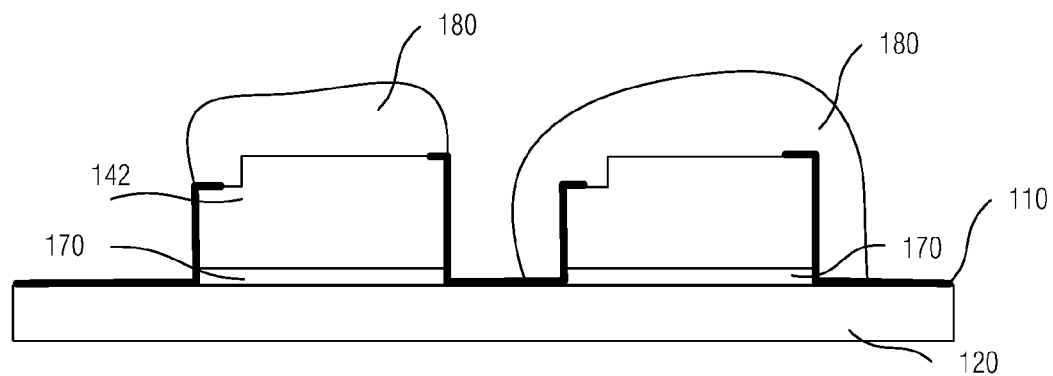
FIG. 7A is a side view of a LED circuit with a glop-top, according to an example.
Figure 7B:
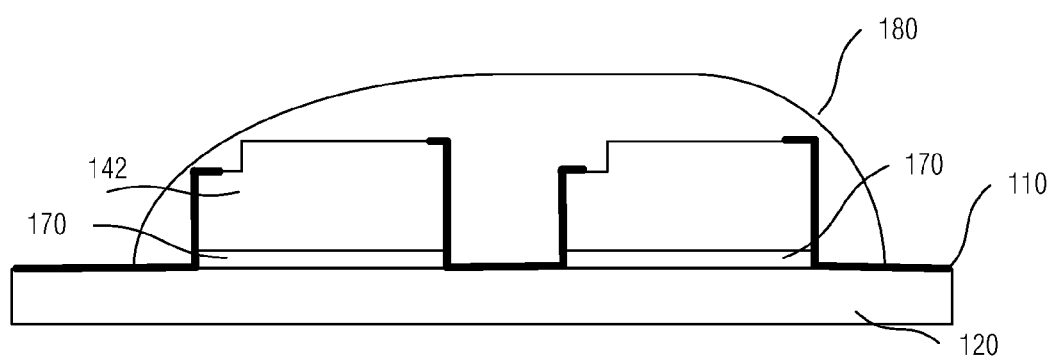
FIG. 7B is a side view of a LED circuit with a glop-top, according to an example.

FIG. 7A and FIG. 7B are side views of a LED circuit 100 with a glop-top 180. A glop-top 180 can cover the topside of a horizontal bare LED die 142, vertical bare LED die 144, or flip chip bare LED die 146. The glop-top 180 can cover a single bare LED die. The glop-top 180 can cover more than one bare LED die. There can be more than one glop-top 180 in a circuit 100. The glop-top 180 can encapsulate a bare LED die. The glop-top 180 can include phosphor, such as to create white light. The glop-top 180 can include adhesive 170.

Figure 8A:
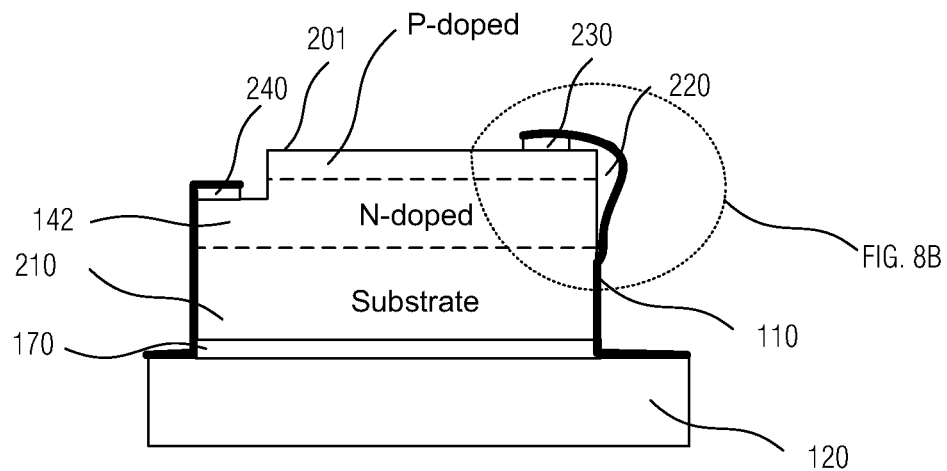
FIG. 8A is a side view of a horizontal bare LED die, according to an example.

FIG. 8A is a side view of a horizontal bare LED die 142. A horizontal bare LED die 142 can include a first mesa 201. Printing a line of conductive ink 110 on the first mesa 201 can affect the performance of the horizontal bare LED die 142, such as by providing a current path between the P-region and the N-region. Accordingly, an insulator 220 can be disposed, for example by printing, on the die 142. The insulator 220 can insulate the N-region from the P-region so that conductive ink 110 can extend across a portion of the die where the N-region and the P-region are disposed adjacent one another. In the illustrated example, an insulator extends from alongside a P-type pad, across an exposed top portion of a P-region, down along a side portion of the P-region, and onto an N-region.

The insulator 220 can be printed on the die 142, such as with an aerosol jet printer. An aerosol jet printer can print the insulator, such as to insulate the N-region from the conductive ink 110 that is coupled to the P-region.

Examples of insulator 220 include, but are not limited to, nonconductive materials such as polymer films, sprays, tape and other electrically insulative materials. Insulating the first mesa 201 from the conductive ink 110 can improve performance of the horizontal bare LED die 142. The insulator 220 can be printed on the first mesa 201 prior to the conductive ink 110 being printed. There can be more than one insulator 220 printed on a horizontal bare LED die 142.

Figure 8B:
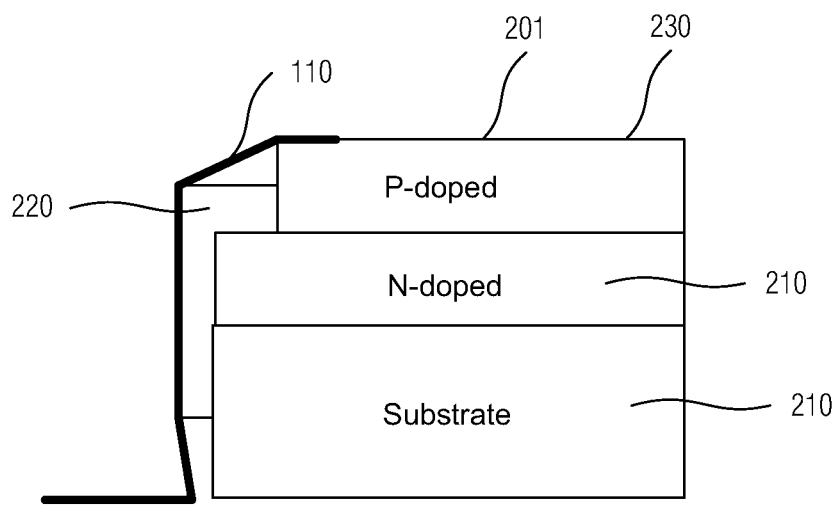
FIG. 8B is a side view of a horizontal bare LED die, according to an example.

FIG. 8B is a side view of a horizontal bare LED die 142. A horizontal bare LED die 142 can include a first mesa 201. Printing a line of conductive ink 110 on the first mesa 201 can affect the performance of the horizontal bare LED die 142, such as by providing a current path between the P-region and the N-region. Accordingly, an insulator 220 can be printed on the die 142, such as to insulate the N-region from the P-region so that conductive ink 110 can extend across a portion of the die where the N-region and the P-region are disposed adjacent one another. In the illustrated example, an insulator extends from alongside a P-type pad, across an exposed top portion of a P-region, down along a side portion of the P-region, and onto an N-region. In the pictured example, the insulator has an L-shaped cross-section. In the example, there is no raised P-type connection pad, and the conductive ink 110 extends onto the P-region.

Figure 9:
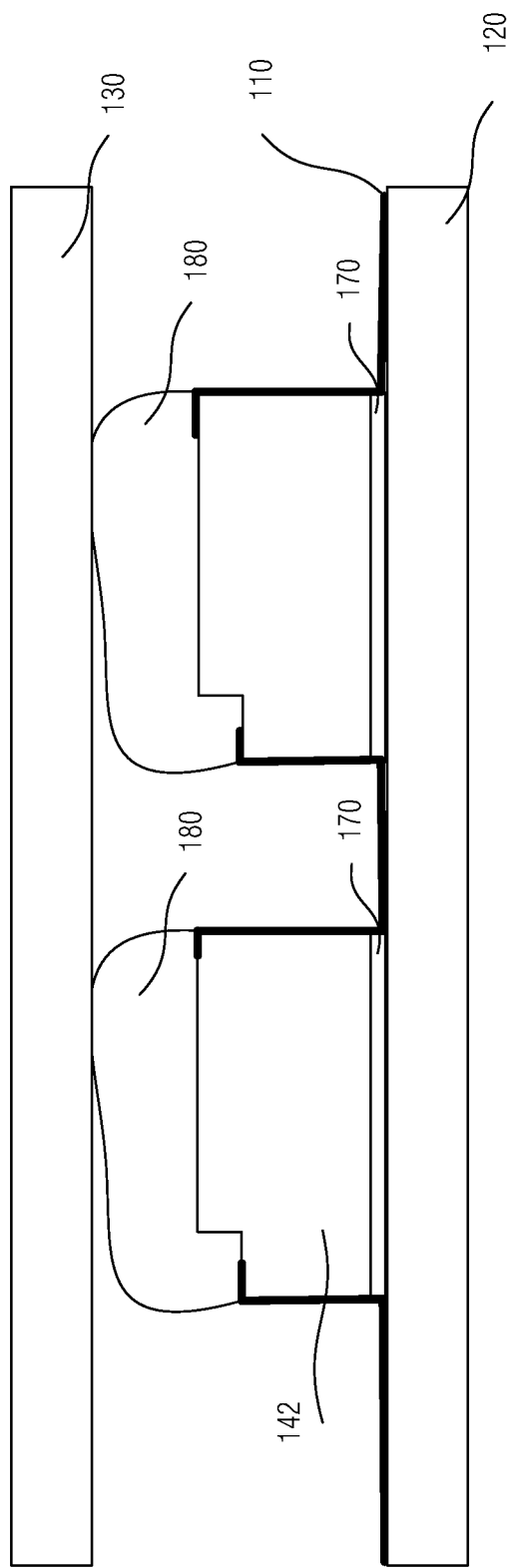
FIG. 9 is a side view of a LED circuit with a second substrate, according to an example.

FIG. 9 is a side view of a LED circuit 100 with a second substrate 130. The second substrate 130 sandwiches the die 142 against the first substrate 120. In an example, a glop-top 180 is disposed on a die 142 and is sandwiched between the first substrate 120 and the second substrate 130. The second substrate 130 can be transparent. The second substrate 130 can be the same material as the first substrate 120. The second substrate 130 can be the same shape as the first substrate 120. The second substrate 130 can be the same size as the first substrate 120. The second substrate 130 can comprise a diffusing material, such as to reduce the pointing effect of the LEDs 140. The circuit 100 can be enclosed by the first substrate 120 and the second substrate 130. A circuit 100 can extend onto more than one side of a substrate, such as by wrapping around to opposing major faces of a ribbon-shaped substrate. In an example, the glop-top 130 can conform to the second substrate 130.

Figure 10:
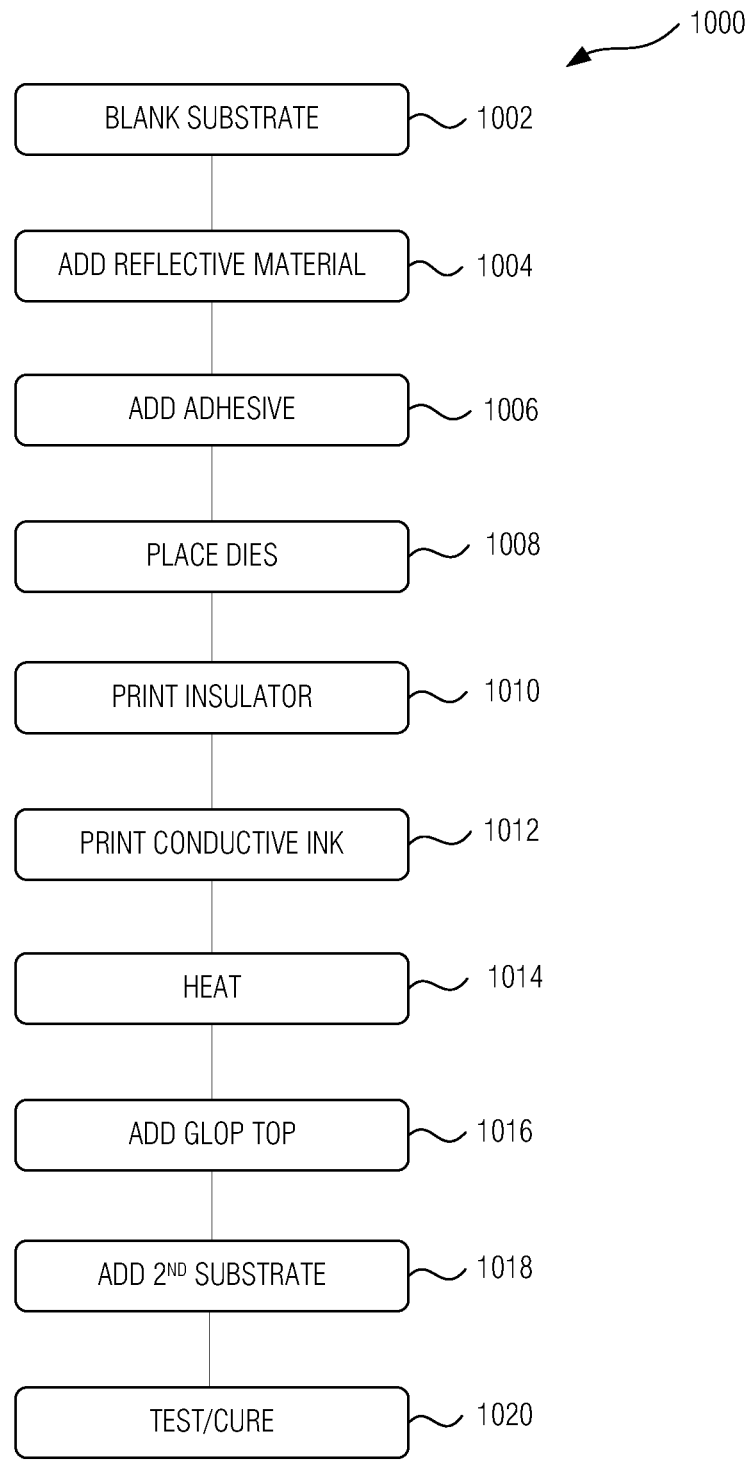
FIG. 10 is an example of a method of creating a circuit with one or more LEDs, according to an example.

FIG. 10 is an example of a method 1000 of creating a circuit, such as circuit 100, with one or more horizontal bare LED dies, such as dies 142, according to an example. A circuit, such as circuit 100, can be formed using a method including printing conductive ink, such as ink 110, onto a substrate or a horizontal bare LED die, such as die 142. At 1002, a blank substrate can be used for the first substrate, such as substrate 120. At 1004, the first substrate, such as substrate 120, can have a reflective material added to it, such as to reflect light from the bottom surface of a horizontal bare LED die, such as die 142. At 1006, an adhesive, such as adhesive 170, can be added to the first substrate, such as substrate 120. The adhesive, such as adhesive 170, can include phosphor. The adhesive, such as adhesive 170, can be conductive. The adhesive, such as adhesive 170, can be an insulator.

At 1008, one or more horizontal bare LED die, such as die 142, can be placed in the adhesive, such as adhesive 170, on the first substrate, such as substrate 120. The adhesive, such as adhesive 170, can be uncured when a horizontal bare LED dies, such as dies 142, is placed in the adhesive, such as adhesive 170, on the first substrate, such as substrate 120. The adhesive, such as adhesive 170, can couple a horizontal bare LED die, such as die 142, to the first substrate, such as substrate 120, such as to secure the horizontal bare LED die, such as die 142.

In an example, a horizontal bare LED die, such as die 142, can have a mesa, such as first mesa 201. At 1010, an insulator, such as insulator 220, can be printed. In an example, the insulator is printed on a mesa, such as first mesa 201, such as to insulate the mesa, such as first mesa 201, from the conductive ink, such as ink 110. At 1012, conductive ink, such as ink 110, can be printed on the first substrate, such as substrate 120. Conductive ink, such as ink 110, can be printed on one or more horizontal bare LED dies, such as dies 142. Conductive ink, such as ink 110, can be printed on the first substrate, such as substrate 120, and the horizontal bare LED dies, such as dies 142, such as to connect the bare LED dies in order to create a circuit, such as circuit 100, or part of a circuit.

At 1014, heat can be added to the circuit, such as circuit 100, such as to melt or fuse the conductive ink, such as ink 110. Conductive ink, such as ink 110, can be printed in a series of dots. Heating the conductive ink, such as ink 110, can melt or fuse the dots. Fusing the dots of conductive ink, such as ink 110, can connect each dot together, such as to create a line of conductive ink, such as ink 110, that can conduct electricity to each part of the circuit, such as circuit 100. A line of conductive ink, such as ink 110, can conduct electricity to each part of the circuit, such as circuit 100, such as to electrically connect each component of the circuit, such as circuit 100.

At 1016, a glop-top, such as glop-top 180, can be added to the circuit, such as circuit 100, such as to encapsulate a bare LED die. The glop-top, such as glop-top 180, can encapsulate a single bare LED die. The glop-top, such as glop-top 180, can encapsulate a plurality of bare LED dies. There can be more than one glop-top, such as glop-top 180, in a circuit, such as circuit 100. The glop-top, such as glop-top 180, can comprise adhesive, such as adhesive 170. The glop-top, such as glop-top 180, can comprise phosphor.

At 1018, a second substrate 130 can be added to the circuit, such as circuit 100. The second substrate 130 can be on the opposite side of the circuit, such as circuit 100, from the first substrate, such as substrate 120. The second substrate 130 can be the same shape as the first substrate, such as substrate 120. The second substrate 130 can be the same size as the first substrate, such as substrate 120. The second substrate 130 can be the same material as the first substrate, such as substrate 120.

The circuit, such as circuit 100, can be enclosed by the first substrate, such as substrate 120, and the second substrate 130. The circuit, such as circuit 100, can be attached to a power source, such as to power the bare LED dies. At 1020, the bare LED dies can be powered such as to ensure that each of the bare LED dies in the circuit, such as circuit 100, is properly connected to the circuit, such as circuit 100. Powering to the bare LED dies can aid in curing the adhesive, such as adhesive 170, such as if the bare LED die emits UV rays.

Figure 11:
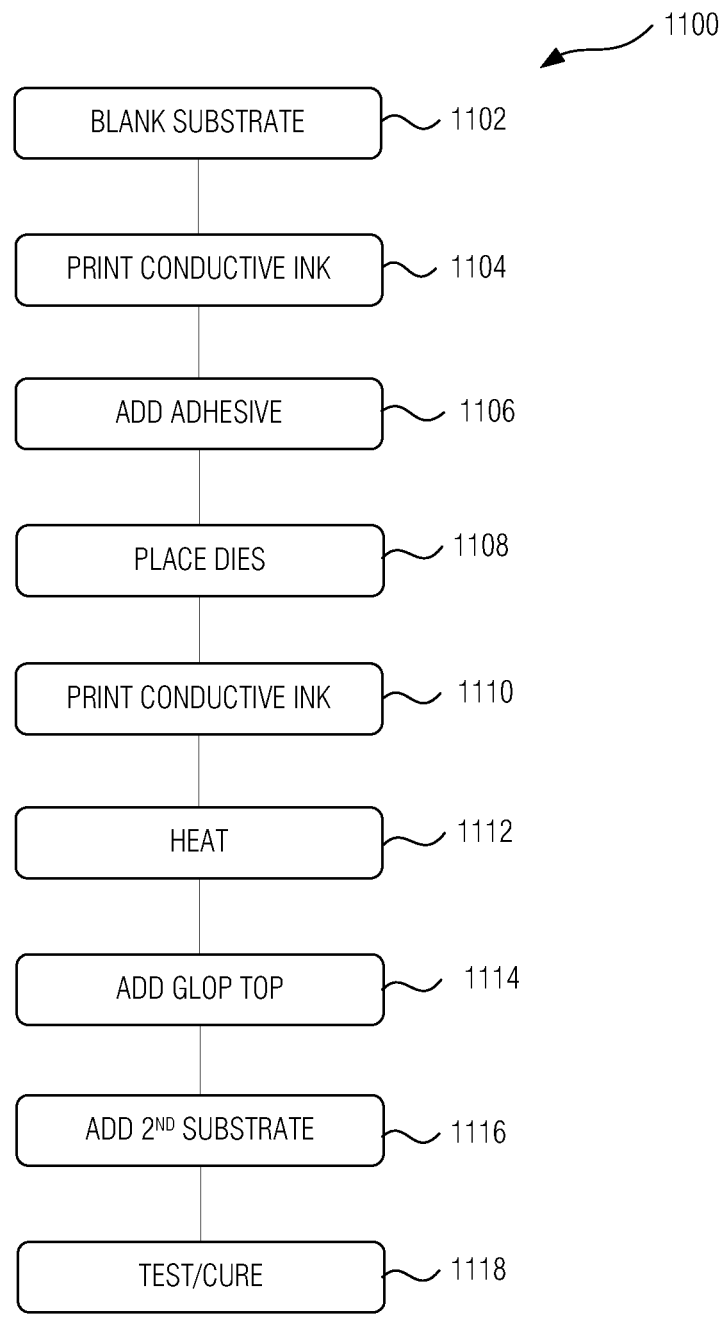
FIG. 11 is an example of a method of creating a circuit with one or more LEDs, according to an example.

FIG. 11 is an example of a method of creating a circuit, such as circuit 100, with one or more vertical bare LED dies, such as dies, such as dies 144, according to an example. At 1002, a blank substrate can be used for the first substrate, such as substrate 120. At 1004, one or more lines of conductive ink, such as ink 110, can be printed on the first substrate, such as substrate 120. One line can be for the N-pads, such as N-pads 240, and a second line can be for the P-pads 230.

The N-pad, such as N-pad 240, can be on the bottom of the vertical bare LED die, such as die 144. The P-pad, such as P-pad 230, can be on the top of the vertical bare LED die, such as die 144. The lines can be non-continuous.

At 1106, adhesive, such as adhesive 170, can be added to the substrate, such as to couple the vertical bare LED dies, such as dies 144, to the first substrate, such as substrate 120. The adhesive, such as adhesive 170, can be conductive. The adhesive, such as adhesive 170, can connect the non-continuous segments of the line of conductive ink, such as ink 110, for the N-pads, such as N-pads 240.

At 1108, the vertical bare LED dies, such as dies 144, for the circuit, such as circuit 100, can be placed in the adhesive, such as adhesive 170, such as to couple the vertical bare LED dies, such as dies 144, to the first substrate, such as substrate 120.

The adhesive, such as adhesive 170, can be uncured when the bare LED dies are placed in the adhesive, such as adhesive 170. The adhesive, such as adhesive 170, can connect the N-pad, such as N-pad 240, of the vertical bare LED die, such as die 144, to the line for the N-pads, such as N-pads 240, such as to create an electrical connection between the N-pad, such as N-pad 240, and the first line of conductive ink, such as ink 110.

At 1110, a second stage of printing can include printing a second line of conductive ink, such as ink 110, such as if only one line of conductive ink, such as ink 110, was printed in the first stage of printing. The second line of conductive ink, such as ink 110, can be for the P-pads, such as P-pads 230. The second stage of printing can include printing conductive ink, such as ink 110, to create a continuous second line of conductive ink, such as ink 110. The second line of conductive ink, such as ink 110, can include contact with each of the P-pads, such as P-pads 230, in the circuit, such as circuit 100, such as to create an electrical connection between the P-pads, such as P-pads 230, and the second line of conductive ink, such as ink 110.

The conductive ink, such as ink 110, can be printed from the first substrate, such as substrate 120, up the side of the vertical bare LED die, such as die 144. The conductive ink, such as ink 110, can be printed up the side of the vertical bare LED die, such as die 144, and across the top of the vertical bare LED die, such as die 144. The conductive ink, such as ink 110, can be printed across the P-pad, such as P-pad 230. The conductive ink, such as ink 110, can be printed on a second side of the vertical bare LED die, such as die 144. The conductive ink, such as ink 110, can be printed from the second side of the vertical bare LED die, such as die 144, to a line of conductive ink, such as ink 110, on the first substrate, such as substrate 120.

At 1112, heat can be added to the circuit, such as circuit 100, such as to melt or fuse the dots of conductive ink, such as ink 110. Fusing the dots of conductive ink, such as ink 110, can connect each dot together, such as to create a line of conductive ink, such as ink 110, that can conduct electricity to each part of the circuit, such as circuit 100. A line of conductive ink, such as ink 110, can conduct electricity to each part of the circuit, such as circuit 100, such as to electrically connect each component of the circuit, such as circuit 100.

At 1114, a glop-top, such as glop-top 180, can be added to the circuit, such as circuit 100, such as to encapsulate a bare LED die. The glop-top, such as glop-top 180, can encapsulate a single bare LED die. The glop-top, such as glop-top 180, can encapsulate a plurality of bare LED dies. There can be more than one glop-top, such as glop-top 180, in a circuit, such as circuit 100. The glop-top, such as glop-top 180, can comprise adhesive, such as adhesive 170. The glop-top, such as glop-top 180, can comprise phosphor.

At 1116, a second substrate 130 can be added to the circuit, such as circuit 100. The second substrate 130 can be on the opposite side of the circuit, such as circuit 100, from the first substrate, such as substrate 120. The second substrate 130 can be the same shape as the first substrate, such as substrate 120. The second substrate 130 can be the same size as the first substrate, such as substrate 120. The second substrate 130 can be the same material as the first substrate, such as substrate 120.

The circuit, such as circuit 100, can be enclosed by the first substrate, such as substrate 120, and the second substrate 130. The circuit, such as circuit 100, can be attached to a power source, such as to power the bare LED dies. At 1118, the bare LED dies can be powered such as to ensure that each of the bare LED dies in the circuit, such as circuit 100, is properly connected to the circuit, such as circuit 100. Powering to the bare LED dies can aid in curing the adhesive, such as adhesive 170, such as if the bare LED die emits UV rays.

Figure 12:
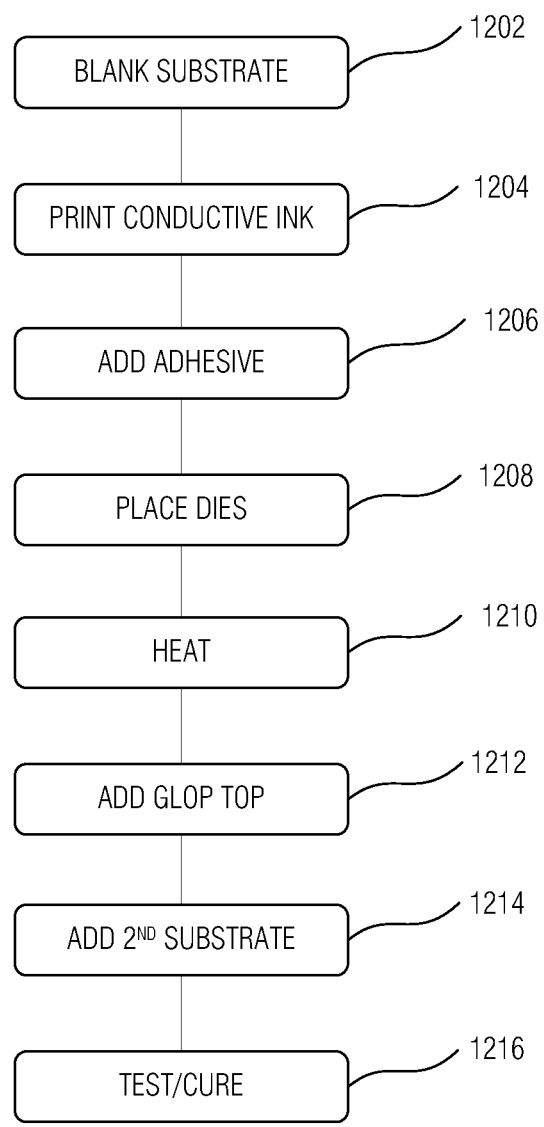
FIG. 12 is an example of a method of creating a circuit with one or more LEDs, according to an example.

FIG. 12 is an example of a method of creating a circuit, such as circuit 100, with one or more flip chip bare LED dies 146, according to an example. At 1202, a blank substrate can be used for the first substrate, such as substrate 120. One or more lines of conductive ink, such as ink 110, can be printed onto the first substrate, such as substrate 120. The lines can be non-continuous, such as to allow placement of flip chip bare LED die 146.

At 1206, adhesive, such as adhesive 170, can be added to the first substrate, such as substrate 120, such as to couple the flip chip bare LED dies 146 to the first substrate, such as substrate 120. The adhesive, such as adhesive 170, can be conductive or non-conductive. Non-conductive adhesive, such as adhesive 170, can couple the flip chip bare LED dies 146 to the first substrate, such as substrate 120. Conductive adhesive, such as adhesive 170, can couple the flip chip bare LED dies 146 to the first substrate, such as substrate 120, and connect the N-pads, such as N-pads 240, and the P-pads, such as P-pads 230, to the printed lines of conductive ink, such as ink 110. At 1208, the flip chip bare LED dies 146 can be placed in the adhesive, such as adhesive 170, such as to couple the flip chip bare LED dies 146 to the first substrate, such as substrate 120.

At 1210, the adhesive, such as adhesive 170, can be uncured when the bare LED dies are place in the adhesive, such as adhesive 170. Heat can be added to the circuit, such as circuit 100, such as to melt or fuse the dots of conductive ink, such as ink 110. Fusing the dots of conductive ink, such as ink 110, can connect each dot together, such as to create a line of conductive ink, such as ink 110, that can conduct electricity to each part of the circuit, such as circuit 100. A line of conductive ink, such as ink 110, can conduct electricity to each part of the circuit, such as circuit 100, such as to electrically connect each component of the circuit, such as circuit 100.

At 1202, a glop-top, such as glop-top 180, can be added to the circuit, such as circuit 100, such as to encapsulate a bare LED die. The glop-top, such as glop-top 180, can encapsulate a single bare LED die. The glop-top, such as glop-top 180, can encapsulate a plurality of bare LED dies. There can be more than one glop-top, such as glop-top 180, in a circuit, such as circuit 100. The glop-top, such as glop-top 180, can comprise adhesive, such as adhesive 170. The glop-top, such as glop-top 180, can comprise phosphor.

At 1204, a second substrate 130 can be added to the circuit, such as circuit 100. The second substrate 130 can be on the opposite side of the circuit, such as circuit 100, from the first substrate, such as substrate 120. The second substrate 130 can be the same shape as the first substrate, such as substrate 120. The second substrate 130 can be the same size as the first substrate, such as substrate 120. The second substrate 130 can be the same material as the first substrate, such as substrate 120.

The circuit, such as circuit 100, can be enclosed by the first substrate, such as substrate 120, and the second substrate 130. The circuit, such as circuit 100, can be attached to a power source, such as to power the bare LED dies. At 1216, the bare LED dies can be powered such as to ensure that each of the bare LED dies in the circuit, such as circuit 100, is properly connected to the circuit, such as circuit 100. Powering to the bare LED dies can aid in curing the adhesive, such as adhesive 170, such as if the bare LED die emits UV rays.

Figure 13A:
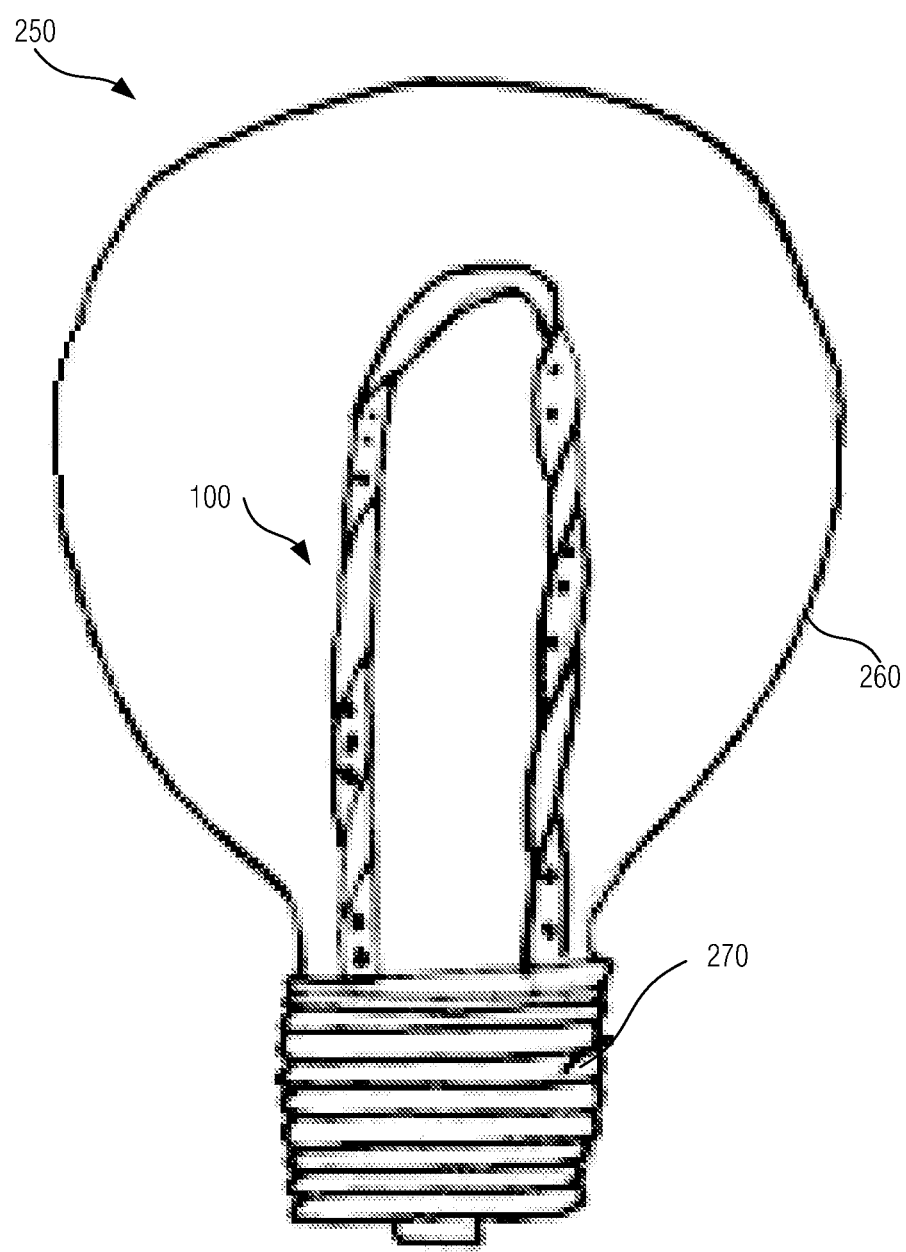
FIG. 13A is an example of a LED circuit in a light bulb configuration, according to an example.

FIG. 13A is an example of a LED circuit 100 in a light bulb 250. In a light bulb 250, there can be a base 270, a circuit 100, and a bulb 260. There can be a base 270 to a light bulb 250, such as to couple the light bulb 250 to light fixture. The base 270 can contain a converter such as to convert an external power supply to the power supply requirement of the circuit 100. The light bulb 250 can include a bulb 260. The bulb 260 can enclose the circuit 100, such as to protect the circuit 100. The bulb 260 can be configured to different shapes.

The bulb 260 can be standard shape. The bulb 260 can be bullet shape. The bulb 260 can be globe shape. The bulb 260 can be tube shape. The bulb 260 can be flare shape. The bulb 260 can be candle shape. The bulb 260 can be reflector shape. Other shapes of the bulb 260 are possible. The bulb 260 can comprise glass. The bulb 260 can comprise plastic. The bulb 260 can comprise a plurality of materials. The bulb 260 can be transparent. The bulb 260 can be colored. The bulb 260 can include diffusing material, such as to equal disperse the light.

The circuit 100 can be in a strip. The strip can be configured to different shapes within the bulb 260. The strip can be in a twisted "U" shape. The strip can have a circuit 100 on one side. The strip can have a circuit 100 on more than one side. The strip can be twisted, such as to have LEDs 140 pointing in a plurality of directions. There can be a single strip in a bulb 260. There can be more than one strip in a bulb 260.

Figure 13B:
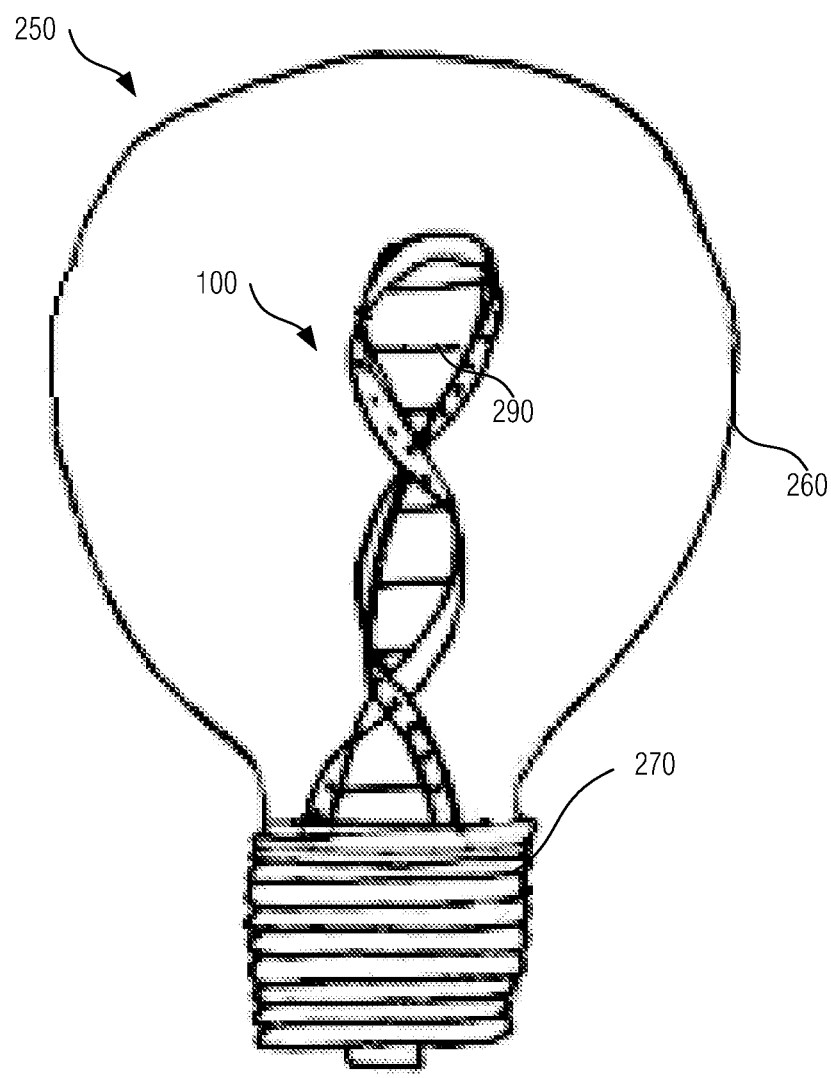
FIG. 13B is an example of a LED circuit in a light bulb configuration, according to an example.

FIG. 13B is an example of a LED circuit 100 in a light bulb 250. In an example, the circuit 100 can be in a double helix configuration. In a double helix configuration there can be cross members 290 between the two sides. The cross members 290 can be a heat sink 200, such as to remove heat from the circuit 100. Additional heat sinks 200 can be added. The cross members 290 can be supportive, such as to aid in supporting the circuit 100 in the double helix configuration. Additional supportive elements can be added.

Figure 13C:
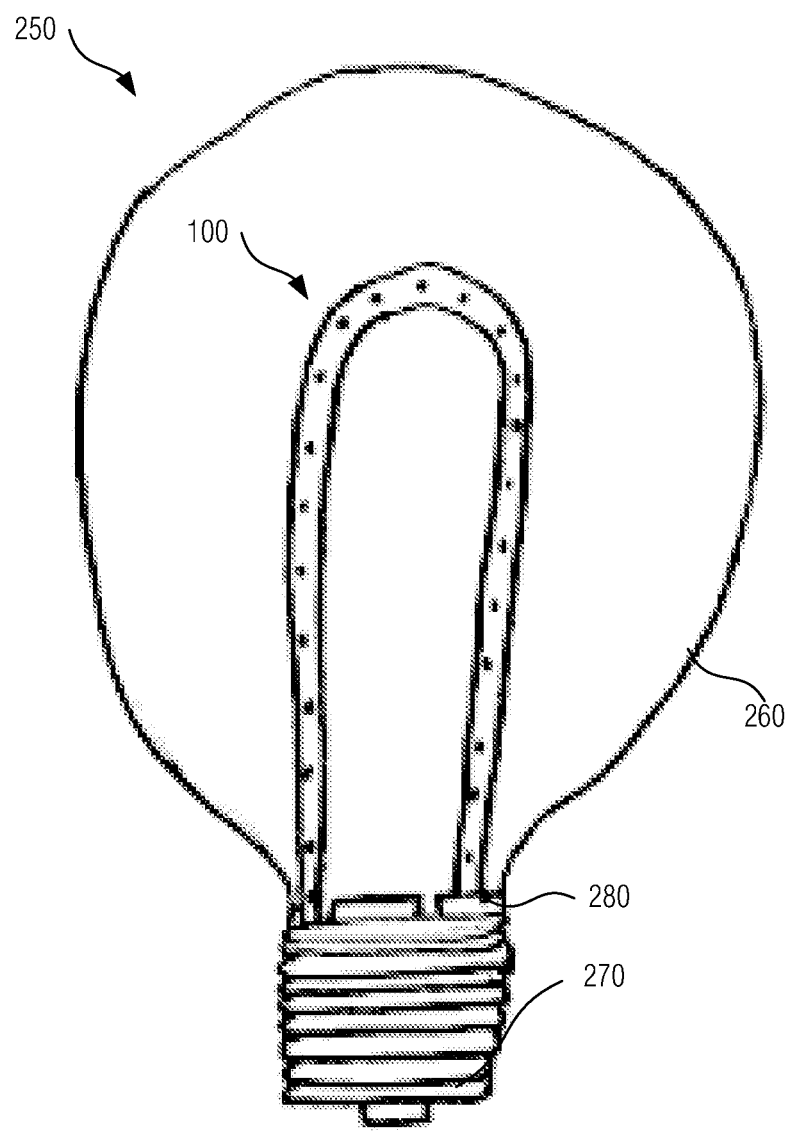
FIG. 13C is an example of a LED circuit in a light bulb configuration, according to an example.

FIG. 13C is an example of a LED circuit 100 in a light bulb 250. In an example, the circuit 100 can form a "U" shape. Vents 280 can be added to the bulb 260, such as to allow the passage of air. The passage of air can remove heat from the bulb 260, such as to prevent overheating.

Figure 14A:
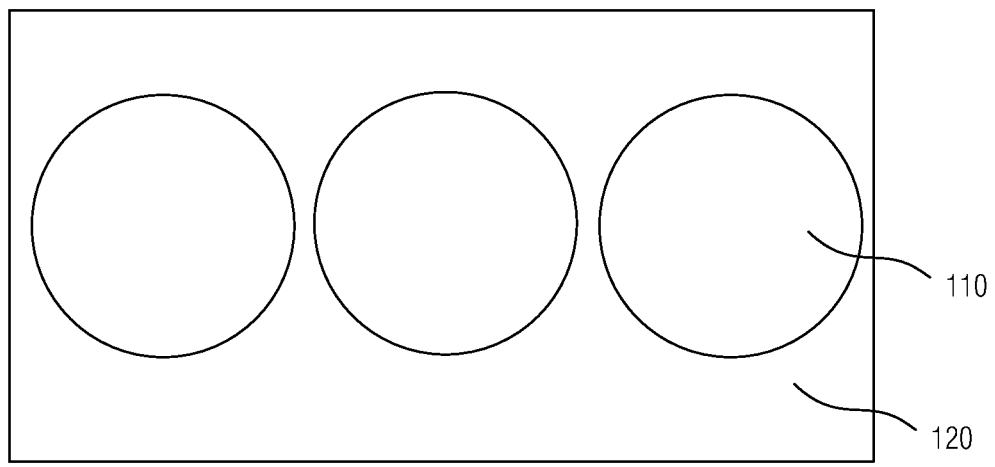
FIG. 14A is a top view of a substrate with nanoparticle-ink printed on it, according to an example.
Figure 14B:
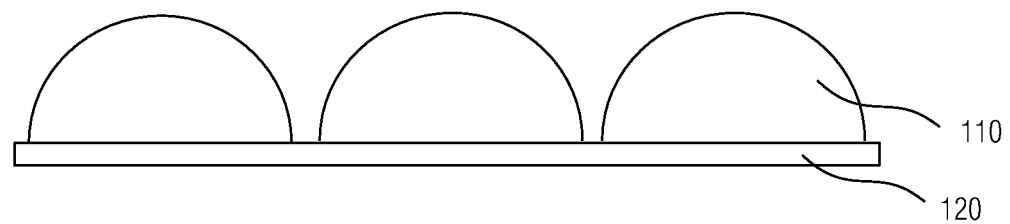
FIG. 14B is a side view of FIG. 14A showing nanoparticle-ink printed on the substrate.

FIG. 14A is a top view of a substrate with conductive ink 110 printed on it. FIG. 14B is a side view of a substrate with conductive ink 110 printed on it. Conductive ink 110 can be printed in dots of ink along the substrate. A continuous line of conductive ink 110 can be made up of a series of dots of conductive ink 110. The dots can be separate from each other prior to the ink being melted or fused.

After the conductive ink 110 is printed on the substrate a fusing stage can take place. During the fusing stage, the dots of conductive ink 110 can be fused together. The dots of conductive ink 110 can lose their dot shape during the fusing process.

Figure 15A:
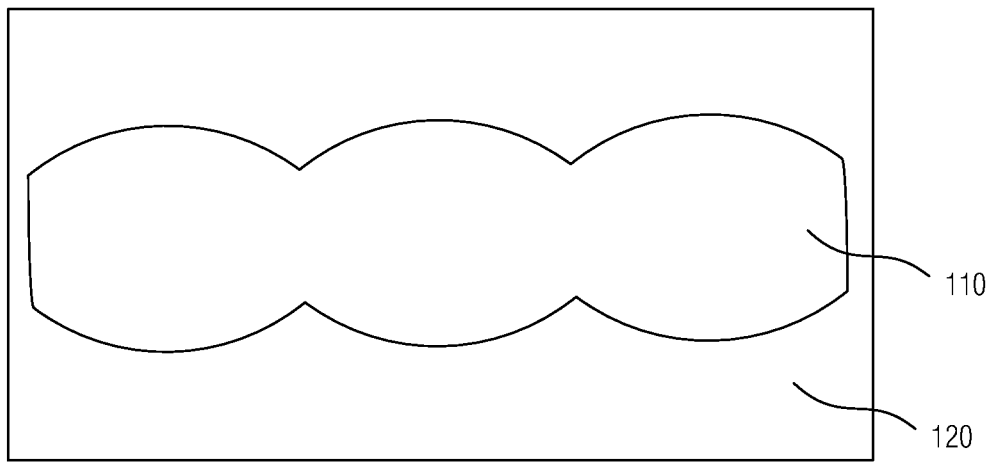
FIG. 15A is a top view of a substrate with nanoparticle-ink printed on it after a fusing stage, according to an example.
Figure 15B:
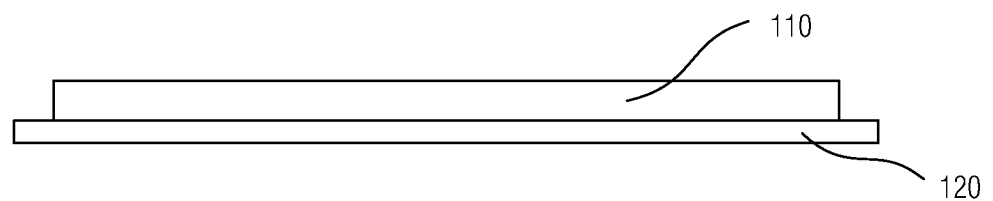
FIG. 15B is a side view of FIG. 15A showing the substrate with nanoparticle-ink printed on it after the fusing stage.

FIG. 15A is a top view of a substrate with conductive ink 110 printed on it after the fusing stage. FIG. 15B is a side view of a substrate with conductive ink 110 printed on it after the fusing stage. After the fusing stage, the continuous line of conductive ink 110 can be a single element that has the ability to conduct electricity.

Various Notes & Examples

Example 1 includes subject matter (such as an apparatus) comprising a planar substrate including a first surface that is planar, at least one bare light emitting diode ("LED") die coupled to the first surface, the at least one bare LED die comprising: a planar N-doped region located substantially parallel to the planar substrate and facing away from the planar substrate and a P-doped region defining a mesa-shaped section facing away from the planar substrate, the P-doped region disposed parallel the N-doped region, further away from the planar substrate than the N-doped region; and an insulator disposed between the N-doped region and the planar substrate, along a portion of the at least one bare LED die, from a side of the mesa, along the N-doped region, and onto a side of the N-doped region.

Example 2 includes the subject matter of example 1, wherein the insulator contacts a surface of a bare LED die that is substantially perpendicular to first surface.

Example 3 includes the subject matter of any one of examples 1-2, wherein a conductive ink is disposed over an edge of the bare LED die, onto two nonplanar sides of the bare LED die.

Example 4 includes the subject matter of any one of examples 1-3, wherein the insulator comprises non-conductive ink.

Example 5 includes the subject matter of any one of examples 1-4, wherein the at least one bare LED die is electrically coupled with the conductive ink.

Example 6 includes the subject matter of any one of examples 1-5, wherein the conductive ink is disposed on the planar substrate and extends onto a surface of the bare LED die that is in a different plane than the planar substrate.

Example 7 includes the subject matter (such as an apparatus) comprising a planar substrate including a first surface that is planar; at least one bare light emitting diode ("LED") die coupled to the planar substrate, the at least one bare LED die comprising: an N-doped region; and a P-doped region defining a mesa-shaped section on disposed further away from the planar substrate than the N-doped region; an insulative chip substrate disposed between the N-doped region and the planar substrate; and conductive ink electrically connected to the at least one bare LED die, wherein the conductive ink is disposed on the planar substrate and extends onto a surface of the LED that is out-of-plane from the first surface of the planar substrate.

Example 8 includes the subject matter of example 7, wherein the conductive ink includes nanoparticle-ink.

Example 9 includes the subject matter of any one of examples 7-8, wherein the nanoparticle-ink comprises silver.

Example 10 includes the subject matter of any one of examples 7-9, wherein the planar substrate is flexible.

Example 11 includes the subject matter of any one of examples 7-10, wherein the conductive ink is disposed on the planar substrate and the surface of the LED die with an aerosol jet printer.

Example 12 includes the subject matter (such as a method) comprising placing at least one bare LED die on a planar substrate having a major face; and printing conductive ink on the planar substrate and at least one bare LED die with an aerosol jet printer to dispose the conductive ink onto the planar surface, a leading side of the at least one bare LED die that extends along a first side plane that intersects the major face, a top of the at least one bare LED die, and a trailing surface of the at least one bare LED die that extends along a second side plane that intersects the major face.

Example 13 includes the subject matter of example 12, wherein the head of the aerosol jet printer is at a 45° angle with respect to a plane of the planar substrate, and the first and second side planes are substantially parallel, perpendicular with the top and the major face.

Example 14 includes the subject matter of any one of examples 12-13, wherein the printing conductive ink includes printing a nanoparticle ink.

Example 15 includes the subject matter of any one of examples 12-14, wherein printing includes heating the nanoparticle-ink.

Example 16 includes the subject matter of any one of examples 12-15, comprising disposing a glop-top onto the bare LED die.

Example 17 includes the subject matter of any one of examples 12-16, wherein disposing a glop-top includes disposing the glop-top to cover more than one bare LED die.

Example 18 includes the subject matter of any one of examples 12-17, comprising disposing a second planar substrate onto the glop-top.

Example 19 includes the subject matter of any one of examples 12-18, wherein the second planar substrate is at least partially transparent.

Example 20 includes the subject matter of any one of examples 12-19, disposing an insulator onto the at least one bare LED die, alongside a mesa, to cover an N-doped portion of the bare LED die.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
A circuit strip having a twisted "U" shape, the circuit strip comprising:
A transparent substrate including a first surface and a vertically oriented surface perpendicular to the first surface;
at least one bare light emitting diode ("LED") die contacting the first surface of the transparent substrate, each of the at least one bare LED die comprising:
planar N-doped region having a vertical surface and a surface positioned parallel to the transparent substrate and facing the first surface of the transparent substrate; and
a P-doped region having a vertical surface and defining a mesa-shaped surface facing away from the first surface of the transparent substrate, the P-doped surface disposed parallel the N-doped surface;
an insulator comprising non-conductive ink contacting vertical surfaces of the N-doped region, and the P-doped region of at least one of the bare LED dies and substrate; and
conductive ink contacting the insulator wherein the at least one bare LED die is electrically coupled with the conductive ink.

2. The apparatus of claim 1, wherein the insulator is positioned in a manner effective to insulate the N-region from the P-region so that conductive ink is extendible across a portion of the die where the N-region and the P-region are disposed adjacent one another.

3. The apparatus of claim 1, wherein the LED further comprises a GLOB-top.

4. The apparatus of claim 3, further comprising a second substrate that overlays at least a portion of the GLOB-top.

5. The apparatus of claim 4, wherein the second substrate is transparent.

6. The apparatus of claim 1, wherein the LED's are coupled to make a circuit.

7. The apparatus of claim 1, wherein the substrate is flexible.

8. The apparatus of claim 1, wherein the substrate is transparent.

9. The apparatus of claim 1, further comprising an adhesive for adhering the LED die to the substrate.

10. An apparatus, comprising:
A circuit strip having a twisted "U" shape, the circuit strip comprising:
a transparent substrate including a first surface;
at least one bare light emitting diode ("LED") die coupled to the substrate, each of the at least one bare LED die comprising:
a first N-doped region; and
another doped region defining a mesa-shaped section;

an insulative chip substrate disposed between the N-doped region and the transparent substrate; and conductive ink electrically connected to the at least one bare LED die, wherein the conductive ink contacts the transparent substrate and extends onto a surface of the LED that is out-of-plane from the first surface of the transparent substrate.

11. The apparatus of claim 10, wherein the conductive ink comprises nanoparticle-ink.

12. The apparatus of claim 11, wherein the nanoparticle-ink comprises silver.

13. The apparatus of claim 10, wherein the substrate is flexible.

14. The apparatus of claim 10, wherein the conductive ink contacts the substrate and the surface of the LED die to form a pattern.

15. The apparatus of claim 10, wherein the LED further comprises a GLOB-top.

16. The apparatus of claim 15, further comprising a second substrate that overlays at least a portion of the GLOB-top.

17. The apparatus of claim 16, wherein the second substrate is transparent.

18. The apparatus of claim 10, wherein the LED's are coupled to make a circuit.

19. An apparatus, comprising:

A circuit strip having a twisted "U" shape, the circuit strip comprising:

A substrate through which light is radiated, including a horizontally-oriented surface and a vertically oriented surface;

at least one bare light emitting diode ("LED") contacting the horizontally-oriented surface of the substrate, each of the at least one bare LED die comprising:

planar N-doped region having a vertical surface and a surface positioned parallel to the substrate and facing the horizontally oriented surface of the substrate; and a P-doped region having a vertical surface and defining a mesa-shaped surface facing away from the horizontally oriented surface of the substrate, the P-doped surface disposed parallel the N-doped surface;

an insulator comprising non-conductive ink contacting vertical surfaces of the N-doped region, and the P-doped region of at least one of the bare LED dies and substrate; and conductive ink contacting the insulator wherein the at least one bare LED die is electrically coupled with the conductive ink.

* * * * *